(12) United States Patent
Tsuchida

(10) Patent No.: US 8,228,710 B2
(45) Date of Patent: Jul. 24, 2012

(54) RESISTANCE CHANGE MEMORY DEVICE

(75) Inventor: Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 288 days.

(21) Appl. No.: 12/715,231

(22) Filed: Mar. 1, 2010

(65) Prior Publication Data

US 2010/0238707 A1    Sep. 23, 2010

(30) Foreign Application Priority Data

Mar. 18, 2009  (JP) ................... 2009-066647

(51) Int. Cl.
*G11C 11/00* (2006.01)
(52) U.S. Cl. ....................... 365/148; 365/163
(58) Field of Classification Search .................. 365/148, 365/163, 189.14
See application file for complete search history.

(56) References Cited

U.S. PATENT DOCUMENTS

| | | | |
|---|---|---|---|
| 5,695,864 A | 12/1997 | Slonczewski | |
| 7,457,150 B2 | 11/2008 | Tsuchida et al. | |
| 7,545,672 B2 | 6/2009 | Ueda et al. | |
| 2004/0254647 A1 | 12/2004 | Johnson et al. | |
| 2007/0279963 A1 | 12/2007 | Tsuchida et al. | |
| 2010/0238711 A1* | 9/2010 | Asao | 365/148 |
| 2010/0296330 A1* | 11/2010 | Kotaki et al. | 365/148 |
| 2011/0211390 A1* | 9/2011 | Hanzawa et al. | 365/163 |

FOREIGN PATENT DOCUMENTS

| | | |
|---|---|---|
| JP | 2004-348934 | 12/2004 |
| JP | 2005-071500 | 3/2005 |
| JP | 2007-213639 | 8/2007 |
| JP | 2007-317795 | 12/2007 |
| JP | 2008-123641 | 5/2008 |

OTHER PUBLICATIONS

Notice of Reasons for Rejection mailed by JPO on Jul. 26, 2011, for Japanese Patent Application No. 2009-066647, with English translation.

* cited by examiner

*Primary Examiner* — Anh Phung
(74) *Attorney, Agent, or Firm* — Knobbe Martens Olson & Bear LLP

(57) ABSTRACT

A resistance change memory device includes memory cells including two transistors connected in parallel between a first node and a connecting node and a variable resistance element whose one end is connected to the connecting node. The first node of each memory cell and a second node, which is the other end of the variable resistance element of the memory cell, are connected to different bit lines. The first node of a one memory cell and the first node of another memory cell which is adjacent on a first side along the second axis to the one memory are connected to the same bit line. The second node of the one memory cell and the second node of still another memory cell which is adjacent on a second side along the second axis to the one memory cell are connected to the same bit line.

9 Claims, 18 Drawing Sheets

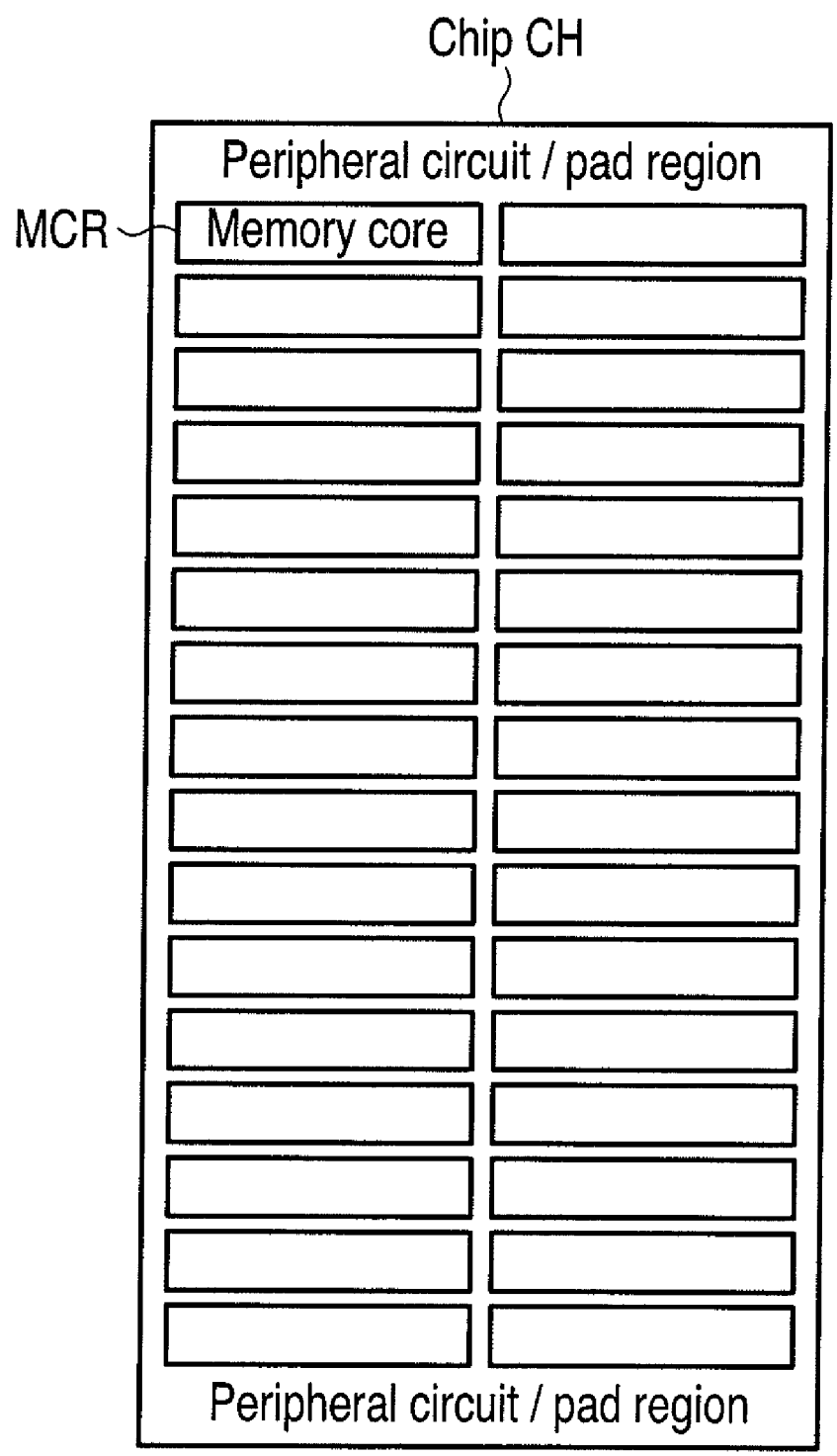
F I G. 1

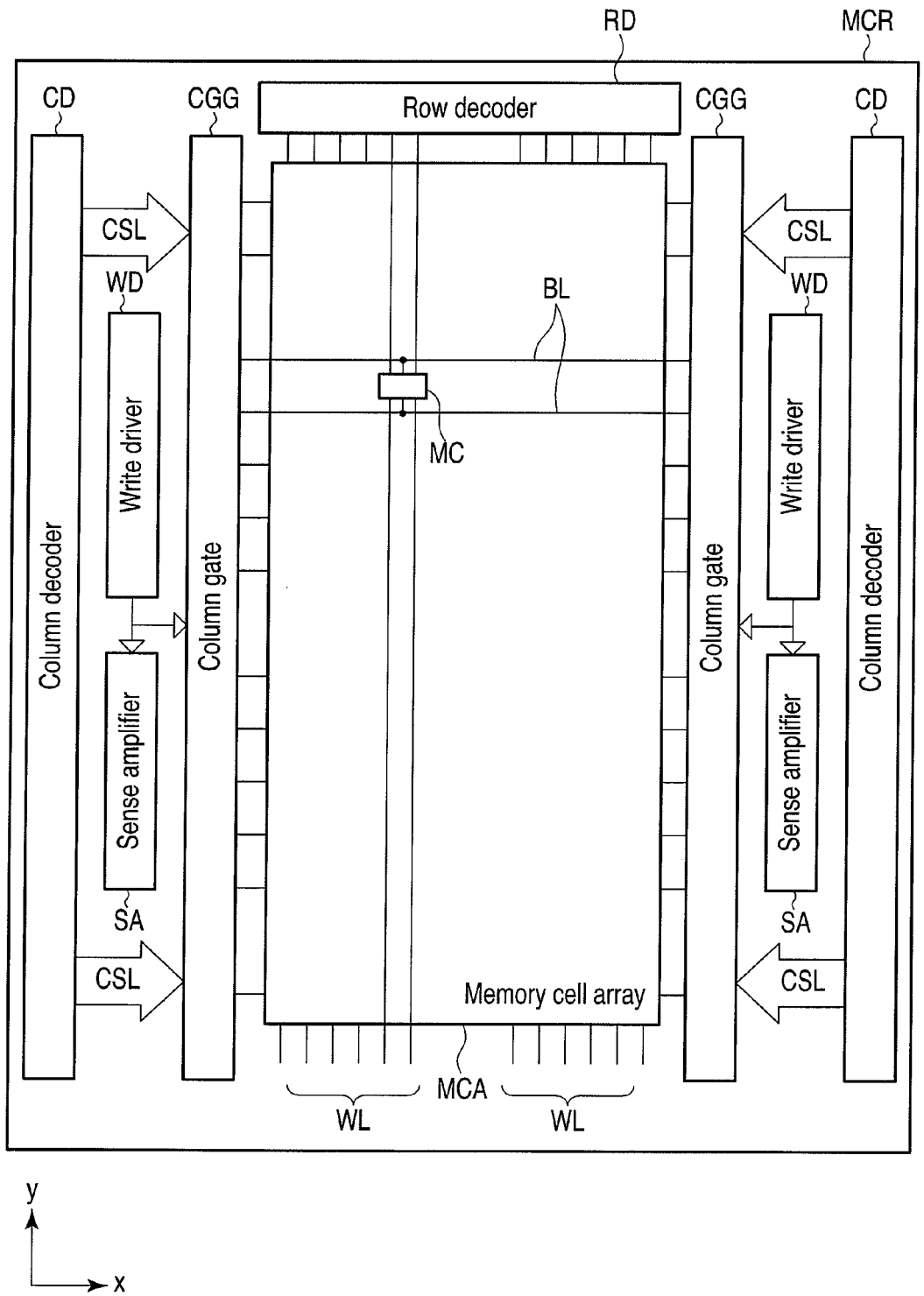
F I G. 2

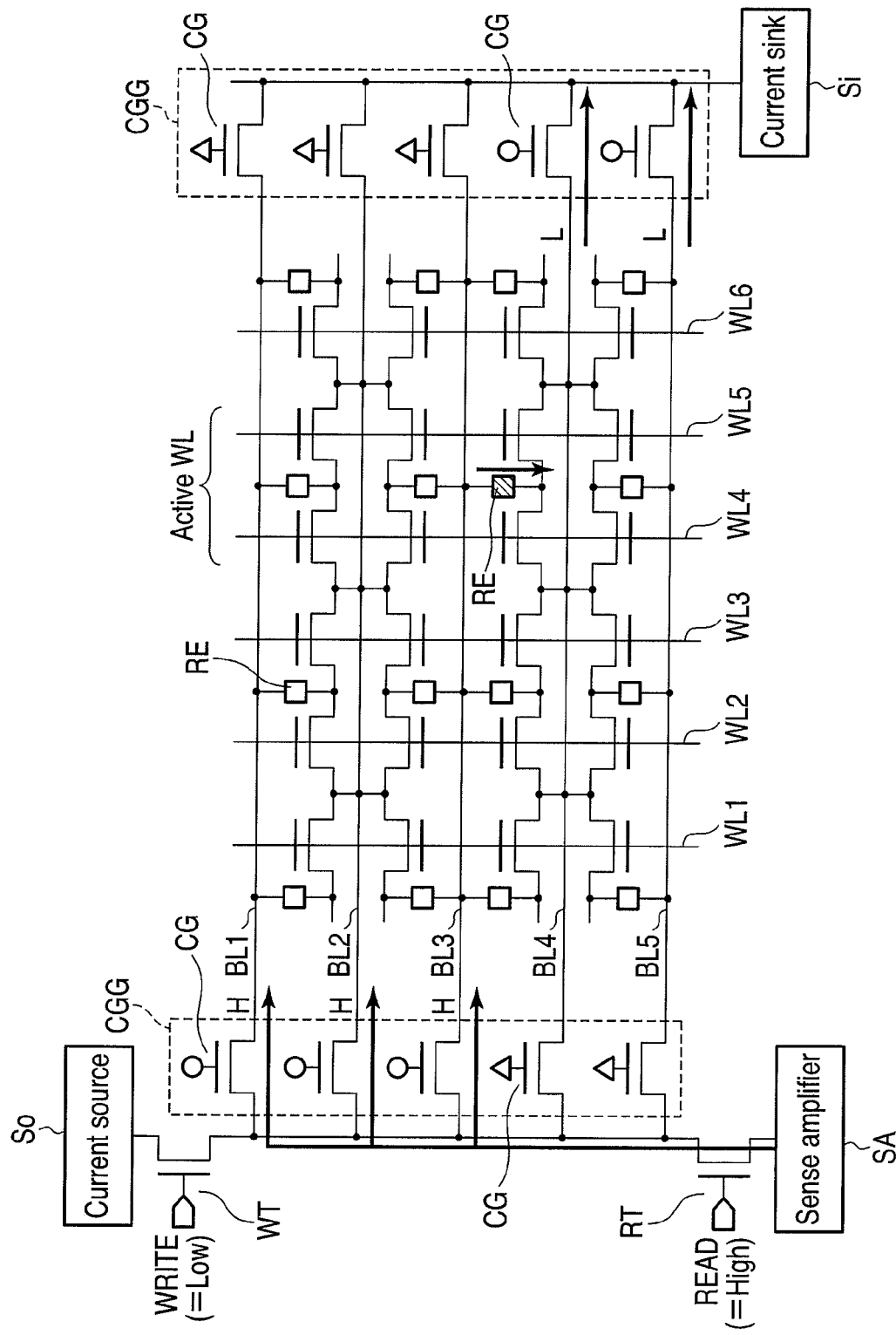
F I G. 11

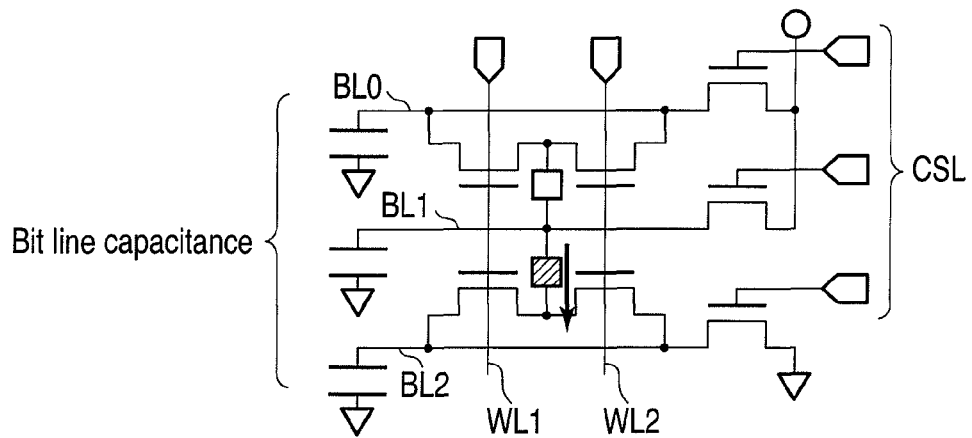
F I G. 15
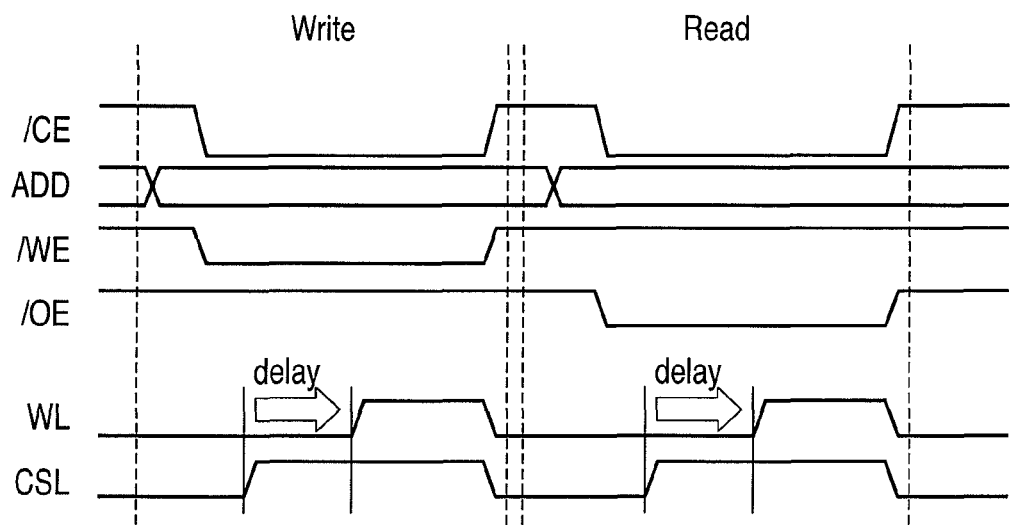
F I G. 16

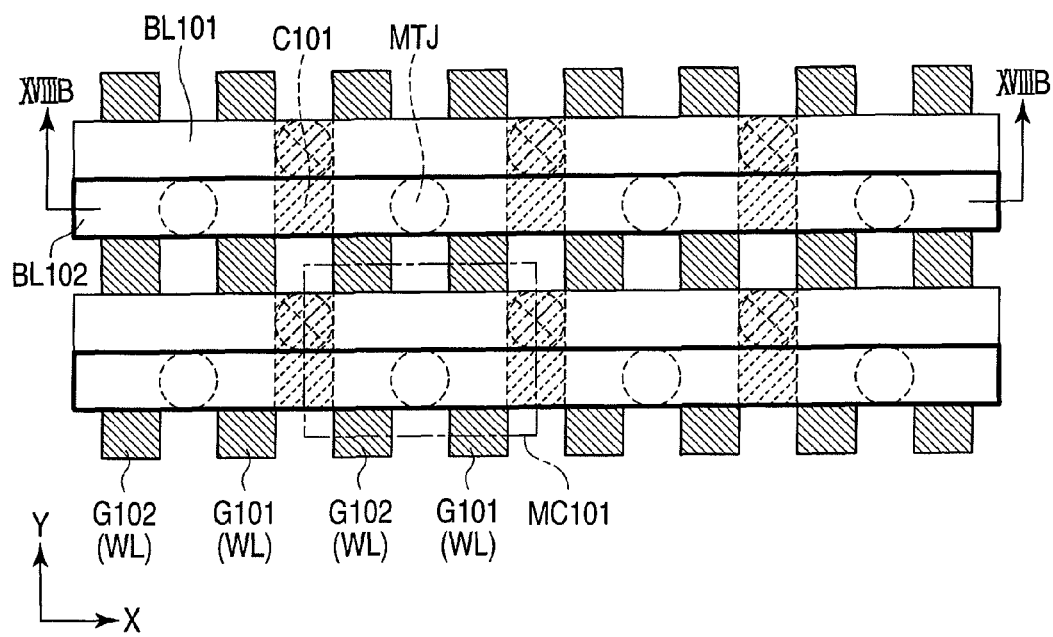
F I G. 18A
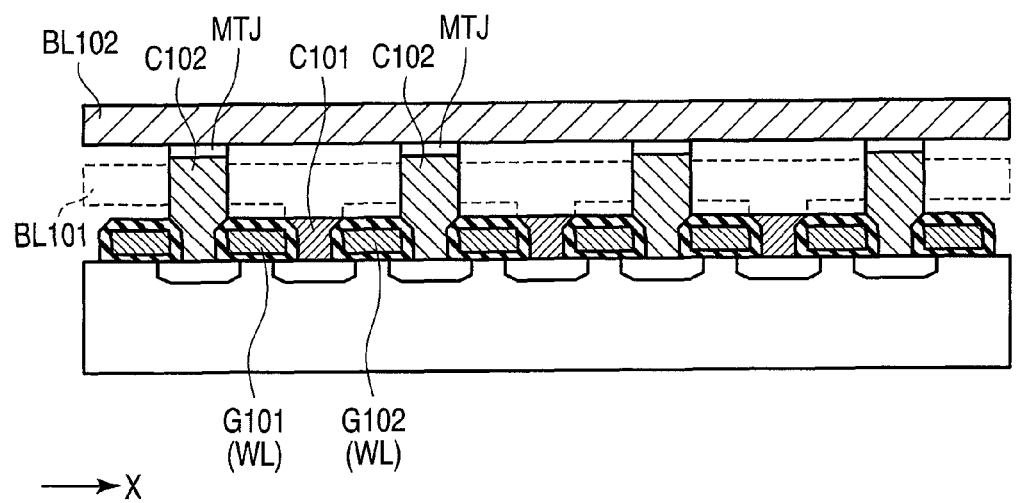
F I G. 18B

RESISTANCE CHANGE MEMORY DEVICE

CROSS-REFERENCE TO RELATED APPLICATIONS

This application is based upon and claims the benefit of priority from prior Japanese Patent Application No. 2009-066647, filed Mar. 18, 2009, the entire contents of which are incorporated herein by reference.

BACKGROUND OF THE INVENTION

1. Field of the Invention

The present invention relates to memory devices, for example, a resistance change memory device.

2. Description of the Related Art

Memory devices which use, as their storage elements, elements whose resistance varies in accordance with their states are known. Such variable resistance elements include magnetoresistive elements exhibiting the magnetoresistive effect. There is known a magnetic random access memory (MRAM) which comprises a memory cell array, in which the magnetoresistive effect elements are arranged in a matrix, and control circuits. The memory cell array and the control circuits enable access to an arbitrary bit in the MRAM.

The magnetoresistive effect includes the tunneling magnetoresistive (TMR) effect, and an element exhibiting the effect is widely used. Such a TMR effect element includes two layers of a ferromagnetic metal sandwiching an insulating film, and is typically implemented by means of a magnetic tunnel junction (MTJ) element which utilizes changes in magnetic resistance caused by the spin polarization tunnel effect. One of two magnetic films in which the orientation of magnetization is fixed is typically referred to as a "pinned layer" or the like. The other magnetic film in which the orientation of magnetization is programmable to be parallel or antiparallel to the pinned layer is referred to as a "free layer" or the like. Reading information held in an MTJ element is enabled by reading resistance determined in accordance with the relationship between the magnetization directions of the two magnetic films of the selected MTJ element by the use of voltage and current.

On the other hand, regarding writing, instead of a "magnetic field write" scheme which changes the magnetization direction of the free layer by applying a magnetic field thereto, a writing scheme referred to as a "spin-transfer torque writing" is proposed. This scheme involves using action of spin-polarized electrons to reverse the magnetization directly in order to perform data writing, as disclosed, for example, in the specification of U.S. Pat. No. 5,695,864. The spin-transfer torque writing scheme enables writing when a current with a density greater than or equal to a certain threshold flows in an element, and therefore can reduce the required current as miniaturization of the element progresses. The most significant issue of the spin-transfer torque writing scheme is reduction in write current density. There are attempts to design ideas about the material and the design of an element for the purpose of overcoming this issue. In addition, measures of designing ideas about circuitry to increase a current flowing in an element are also very important.

A memory cell typically includes one select transistor and one MTJ element which are connected in series. FIG. 66 and the corresponding description of Jpn. Pat. Appln. KOKAI Publication No. 2004-348934 discloses technology of increasing a current in an MTJ element. In the technology, two select transistors connected in parallel are connected in series to an MTJ element, and two cells adjacent to each other along the word line direction share a contact to a first bit line or a second bit line. Since a current is passed to an MTJ element of one memory cell by two select transistors, the current flowing through the MTJ element can be increased to be larger than with only one select transistor. The KOKAI Publication also achieves downsizing of a memory cell. However, the technology is based on a magnetic field write scheme, and therefore cannot be employed as it is for a spin-transfer torque writing scheme. In the spin-transfer torque writing scheme, since different information is written depending on the orientation of the current, bidirectional currents need to flow between the select transistor and the MTJ element. Accordingly, its requirements differ from those of the magnetic field write scheme.

BRIEF SUMMARY OF THE INVENTION

According to one aspect of the invention, there is provided a resistance change memory device comprising: memory cells each comprising two transistors connected in parallel between a first node and a connecting node and a variable resistance element whose one end is connected to the connecting node and which has at least two states different in resistance, the memory cells being arranged in a matrix including a first axis and a second axis; and bit lines, wherein the first node of each memory cell of the memory cells and a second node which is the other end of the variable resistance element of the memory cell are connected to different bit lines among the bit lines, the first node of a first memory cell which is one of the memory cells and the first node of the memory cell which is adjacent on a first side along the second axis to the first memory cell are connected to the same bit line, and the second node of the first memory cell and the second node of the memory cell which is adjacent on a second side along the second axis to the first memory cell are connected to the same bit line.

According to another aspect of the invention, there is provided a resistance change memory device comprising: a semiconductor substrate having a matrix consisting of a first axis and a second axis; a first bit line provided along the first axis above the semiconductor substrate; a first conductive layer provided below the first bit line, electrically connected to the first bit line, and extending along the first axis; a variable resistance element having at least two states different in resistance, and having a top surface connected to a bottom surface of the first conductive layer; a first source/drain region electrically connected to a bottom surface of the variable resistance element and formed on a surface of the semiconductor substrate below the variable resistance element; two gate electrodes provided above the semiconductor substrate on both sides of the first source/drain region; two second source/drain regions formed apart from the first source/drain region on both sides of the first source/drain region, the first source/drain region and the two second source/drain regions sandwiching the two gate electrodes respectively; two second conductive layers having bottom surfaces electrically connected to the two second source/drain regions respectively, and extending along the second axis; and a second bit line electrically connected to the two second conductive layers and extending along the first axis.

BRIEF DESCRIPTION OF THE SEVERAL VIEWS OF THE DRAWING

FIG. 1 shows a layout of a memory chip of a memory device according to a first embodiment;

FIG. 2 shows a layout of a memory core of the memory device according to the first embodiment;

FIG. 11 shows control of reading in the design in which circuits for reading are added to the first example of the third embodiment;

FIG. 15 shows bit lines and their parasitic capacitance;

FIG. 16 shows changes in potential of the main components of a memory device, according to a fourth embodiment;

FIGS. 18A and 18B show a first example of a structure for implementing the circuit of FIG. 17 using a memory cell of a spin-transfer torque writing scheme.

DETAILED DESCRIPTION OF THE INVENTION

The present inventors studied, in the process of development of the invention, technology which applies the technology disclosed in FIG. 66 of Jpn. Pat. Appln. KOKAI Publication No. 2004-348934 to an MRAM of a spin-transfer torque writing scheme. As a result, the inventors made discovery as described below.

Figure 17:
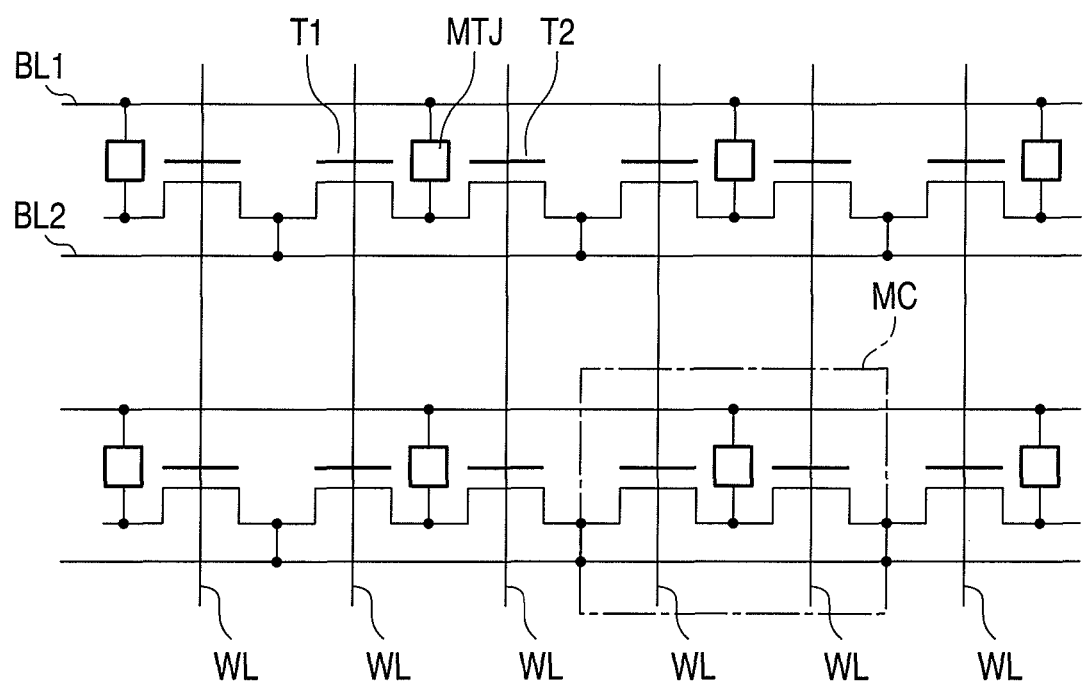
FIG. 17 is an equivalent circuit diagram of the related art.

An equivalent circuit of FIG. 66 of Jpn. Pat. Appln. KOKAI Publication No. 2004-348934 is as shown in FIG. 17. That is, a memory cell comprises two select transistors T1 and T2 connected in parallel and an MTJ element MTJ connected in series to them. The memory cell is connected between each pair of bit lines among bit lines.

FIGS. 18A and 18B show a first example of a structure using a memory cell of the spin-transfer torque writing scheme for implementing the circuit of FIG. 17. FIG. 18A is a layout as seen from the top surface, and FIG. 18B is a sectional view taken along line XVIIIB-XVIIIB in FIG. 18A.

In a memory cell of the spin-transfer torque writing scheme, since written information is determined depending on the current direction, it is necessary to provide two bit lines, i.e. a bit line connected to a the memory cell at the MTJ element side and a bit line at the select transistors side. They are referred to as a "first bit line" and a "second bit line", respectively, and assumed to be implemented as different interconnect layers. Further, it is assumed that the first bit line is connected to a common source/drain region for an interconnect between a pair of source/drain regions of each of two select transistors adjacent to each other, by using a first buried contact layer. Under such an assumption, a structure in which memory cells are arranged in a matrix to enable the densest cell layout corresponds to those shown in FIGS. 18A and 18B. Reference symbols G101 and G102 denote gate electrodes, MTJ denotes an MTJ element, and C101 denotes a first buried contact layer. A second buried contact layer C102 is used for connecting the common source/drain region between the two select transistors adjacent to each other to the second bit line BL102 via the MTJ element.

As can be seen from FIGS. 18A and 18B, the size per bit of a memory cell MC101 is 12 $F^2$ (here, F represents a feature size, and has, for example, a value corresponding to the minimum design rule). What decides this cell size is as follows. Two select transistors connected in parallel are arranged along the x-axis (lateral direction in FIGS. 18A and 18B), and contacts for connection to the first and second bit lines are shared by adjacent cells. These respects are the same as those disclosed in Jpn. Pat. Appln. KOKAI Publication No. 2004-348934. As a result, the size along the x-axis of one memory cell is 4 F. On the other hand, the size along the y-axis (vertical direction in FIGS. 18A and 18B) of one memory cell is 3 F. As clarified from FIG. 18A, what decides this size is that the size of "F" needs to be secured as a space between first buried contacts of adjacent cells connected to the same word lines WL (the gate electrodes G101 and G102). As such, by adopting an approach in which two select transistors connected in parallel are connected in series to an MTJ element, and two memory cells adjacent to each other along the x-axis share a contact to the first bit line or the second bit line, the memory cell structure is intended both to improve the current drive capacity of the select transistors and to reduce the memory cell size. With this structure, 12 $F^2$ is the smallest feasible size. This value is 1.5 times larger than 8 $F^2$, which is the cell size of a dynamic random access memory (DRAM). It has been impossible to implement an MRAM of the spin-transfer torque writing scheme at the same cost as that of a DRAM.

Figure 19A:
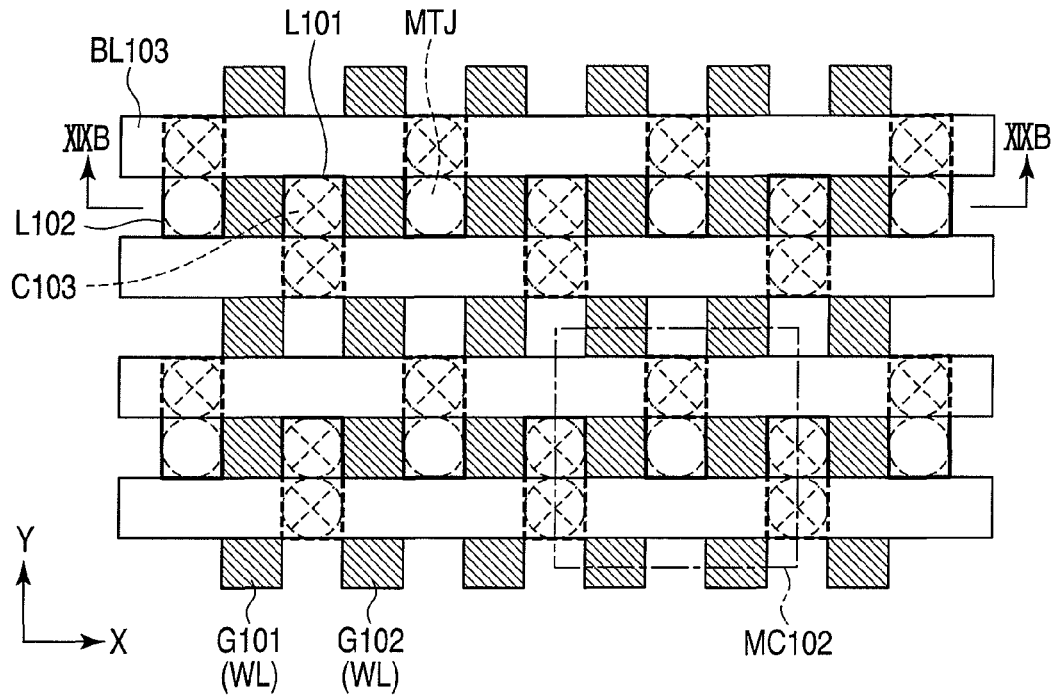
FIGS. 19A and 19B show a second example of the structure for implementing the circuit of FIG. 17 using a memory cell of the spin-transfer torque writing scheme.
Figure 19B:
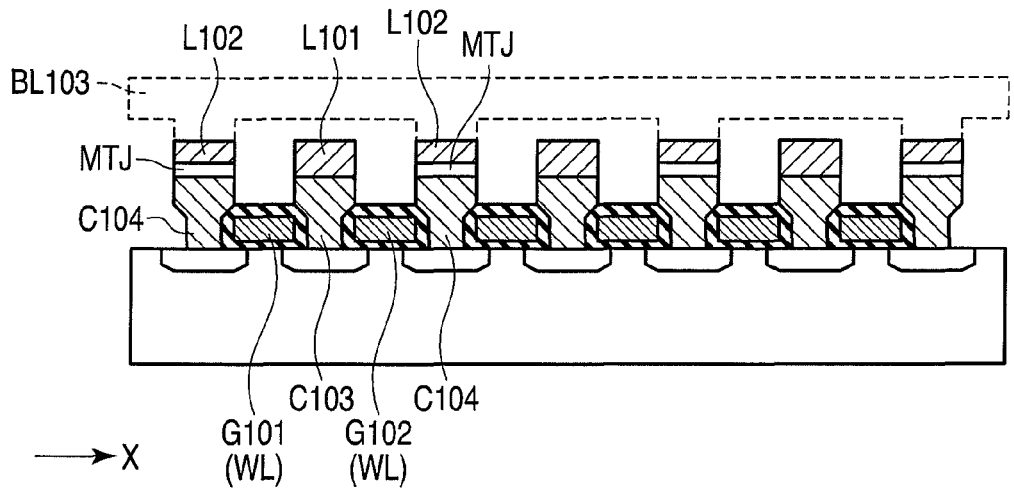

A second example of a structure using a memory cell of the spin-transfer torque writing scheme for implementing the circuit of FIG. 17 is described below. FIGS. 19A and 19B show the second example of the structure using a memory cell of the spin-transfer torque writing scheme for implementing the circuit of FIG. 17. FIG. 19A is a layout as seen from the top surface, and FIG. 19B is a sectional view taken along line XIXB-XIXB in FIG. 19A. While the first and second bit lines are implemented as different interconnect layers in the first example, the bit line is implemented as a single interconnect layer in the second example. Reduction of the number of interconnects constituting a bit line not only leads to cost reduction, but also enables suppression of a decrease in circuit margin caused by manufacturing variations in interconnect resistance to enable implementation of an MRAM with higher performance. As can be seen from FIGS. 19A and 19B, the size per bit of a memory cell MC102 is 16 $F^2$. What decides this cell size is as follows. The size along the x-axis of one memory cell is 4 F, which is the same as in the first example of FIGS. 18A and 18B. On the other hand, the size along the y-axis of one memory cell is 4 F. As such, the memory cell structure, in which the first and second bit lines are implemented as a single interconnect layer, and two select transistors connected in parallel are connected in series to an MTJ element, is intended both to improve the current drive capacity of the select transistors and to reduce the memory cell size. With this structure, 16 $F^2$ is the smallest feasible size. This value is 2 times larger than 8 $F^2$, which is the cell size of a DRAM. It has been impossible to implement a spin-transfer torque MRAM at the same cost as that of a DRAM.

Embodiments of the invention will be described below with reference to the drawings. Note that, in the following description, components having approximately the same functions and designs are denoted by the same reference symbols and the overlapping description will be given only if needed.

Each embodiment described below exemplifies a device and a method for giving a specific form to technical ideas of this invention, and the technical ideas of this invention do not specify quality of materials, shapes, structures, and arrangements of components to those described below. Various changes of the technical ideas of this invention may be made within the scope of the appended claims.

First Embodiment

Next, with reference to FIGS. 1 to 5, a resistance change memory device according to a first embodiment will be described.

FIG. 1 shows a layout of a memory chip of the resistance change memory device according to the first embodiment of the invention. As shown in FIG. 1, a plurality of memory cores MCR are provided in a matrix, for example, of sixteen rows× two columns. In the surroundings of the matrix structure of the memory cores MCR, peripheral circuit/pad regions are provided. In the region, there are provided a peripheral circuit (not shown) required for the operation of the resistance change memory device and pads (not shown) for connecting a memory chip CH to an external device. Note that while FIG. 1 shows an example where the peripheral circuit/pad regions are positioned in chip surrounding portions, they may be positioned at the center of the chip.

FIG. 2 shows the layout of components as the memory cores of FIG. 1 are seen from above. As shown in FIG. 2, included is a memory cell array MCA which is made up of memory cells MC arranged in a matrix. The structure of the memory cell array is to be described in detail later. In the memory cell array MCA, word lines WL are provided along the y-axis (the axis connecting the top and bottom in FIG. 2), and bit lines BL are provided along the x-axis (the axis connecting the left and right in FIG. 2). Provided in an end (an upper end as an example in FIG. 2) of the word line WL is a row decoder RD. The row decoder RD activates the word line WL specified by a signal from the outside to select a given memory cell MC. Provided in both ends of the bit lines BL are column gates CGG. Each column gate CGG is made of a set of column gate circuits CG each connected to each of the bit lines BL as described later. Column decoders CD are provided, for example, outside the column gates CGG, and control the column gates CGG by using column select lines CSL. By using the column select lines CSL, specific bit lines BL are connected to write driver circuits WD during write operation, and are connected to sense amplifier circuits SA during read operation, so that write operation to a selected cell and read operation from the selected cell are performed. The write driver circuit WD has a function of causing a current in a direction in accordance with the position of the selected cell and data to be written to flow according to a signal from the outside. The sense amplifier circuit SA amplifies a current flowing in the selected cell or a voltage of the selected cell.

Figure 3:
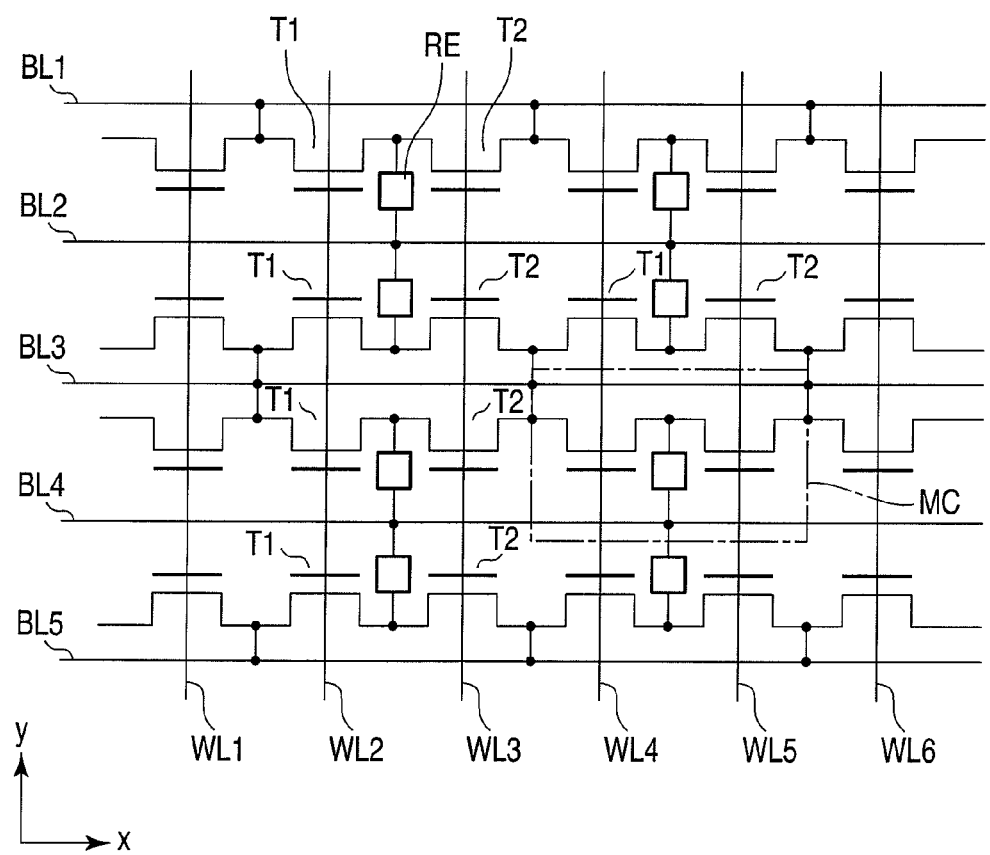
FIG. 3 shows a part of circuits of a memory cell array of the memory device according to the first embodiment.

FIG. 3 is a circuit diagram of a part of the memory cell array of the resistance change memory device according to the first embodiment. As shown in FIG. 3, bit lines BL1 to BL5 are provided along the x-axis, and word lines WL1 to WL6 are provided along the y-axis. Each memory cell MC is provided at an intersection of two adjacent bit lines BL and two adjacent word lines WL, resulting in the memory cell MC arranged in a matrix. One memory cell comprises two select transistors T1 and T2 made of, for example, n-type metal oxide semiconductor field-effect transistors (MOSFETs) and one variable resistance element RE. The select transistors T1 and T2 are connected in parallel. An end (connecting node) of the parallel structure of the select transistors is connected in series to an end of the variable resistance element RE.

The variable resistance element RE is configured to have at least two steady states which differ in resistance. As the variable resistance element RE, for example, an MTJ element for use in an MRAM can be used. The MTJ element is configured to have a low-resistance state or a high-resistance state, for example, by a current of spin-polarized electrons (spin-polarized current) being supplied from one of two terminals to the other, or from the other of the terminals to one. For example, an element for use in a phase change random access memory (PRAM or PCRAM) and an element for use in a resistive random access memory (ReRAM) can be used. The element for use in a PRAM or a PCRAM is switched to a crystalline state, which is a low-resistance state, or an amorphous state, which is a high-resistance state, by causing a suitably controlled current to flow in a cell made of, for example, chalcogenide. The element for use in the ReRAM is in a low-resistance state or a high-resistance state depending on the polarity of an applied voltage.

The memory cell MC is connected between two adjacent bit lines BL. The select transistor T1 of each memory cell MC is connected in series to the select transistor T2 of a memory cell adjacent along the x-axis to the memory cell MC.

Two memory cells MC adjacent to each other along the y-axis are connected to the same bit lines BL. In more detail, an end on a variable resistance element side of one memory cell MC and an end on the variable resistance element side of a first adjacent memory cell MC, which is adjacent along the y-axis to the one memory cell MC, are connected to the same bit line. An end on a select transistor side of the one memory cell MC and an end on the select transistor side of a second adjacent memory cell MC, which is adjacent to the one memory cell MC on the side opposite to the first adjacent memory cell along the y-axis, are connected to the same bit line. Gate electrodes of the select transistors T1 of the memory cells MC which belong to the same column are connected, and likewise gate electrodes of the select transistors T2 of the memory cells MC which belong to the same column are connected.

Assuming a group of memory cells of two rows connected in three continuous bit lines BL in accordance with the above rule as one unit structure, such a unit structure is repeatedly provided along the y-axis.

Figure 4A:
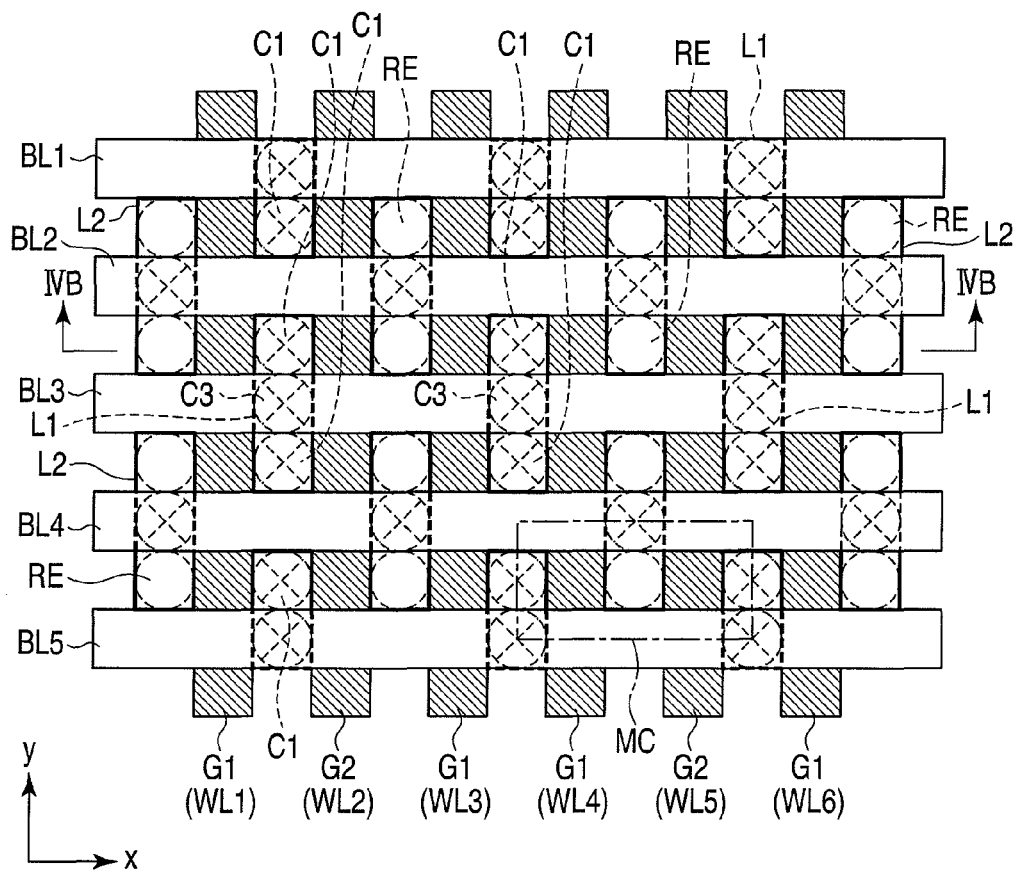
FIGS. 4A and 4B schematically show a part of the memory cell array of the memory device according to the first embodiment.
Figure 4B:
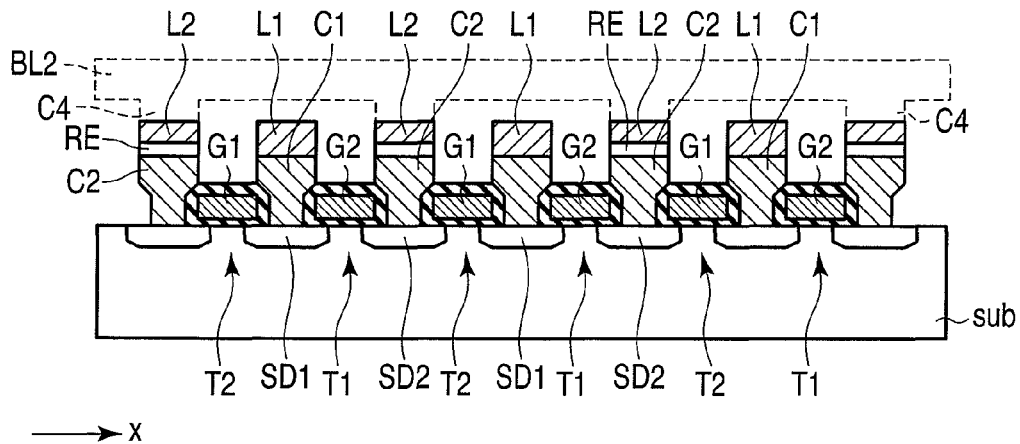

FIG. 4A schematically shows a part of a memory cell array of the resistance change memory device according to the first embodiment, and FIG. 4B schematically shows a structure of a section along line IVB-IVB in FIG. 4A.

As shown in FIGS. 4A and 4B, select transistors T1 and T2 are provided on the surface of a substrate. The select transistors T1 and T2 are alternately arranged, and adjacent two select transistors T1 and T2 share, along the x-axis, the source/drain regions SD1 and SD2. The select transistors T1 and T2 include their respective gate electrodes G1 and G2 (WL) which are provided along the y-axis with a space therebetween. Provided on each source/drain region SD1 with the gate electrode G2 on the right side and the gate electrode G1 on the left side is a contact C1. The top surface of each contact C1 is connected to the bottom surface of a first interconnect L1 provided in a first interconnect layer. Each first interconnect L1 has an island shape extending along the y-axis, which is shown in a bold line in FIG. 4A, and is connected to the top surfaces of two contacts C1 which are adjacent along the y-axis.

Provided on each source/drain region SD2 with the gate electrode G1 on the right side and the gate electrode G2 on the left side is a contact C2. Provided on the top surface of each contact C2 is the variable resistance element RE. The top surface of each variable resistance element RE is connected to the bottom surface of a second interconnect L2 provided in the first interconnect layer. Each second interconnect L2 has an island shape extending along the y-axis, which is shown in a bold line in FIG. 4A, and is connected to the top surfaces of two variable resistance elements RE which are adjacent along the y-axis.

A contact C3 is provided between contacts C1 on the top surface of the first interconnects L1. The top surface of each contact C3 is connected to the bottom surface of one of bit lines BL1, BL3 and BL5 provided in a second interconnect layer, depending on the position of contact C3. A contact C4 is provided between the variable resistance elements RE on the top surface of the second interconnect L2. The top surface of each contact C4 is connected to the bottom surface of either the bit line BL2 or a bit line BL4 provided in the second interconnect layer, depending on the position of the contact C4. The bit lines BL1 to BL5 extend along the x-axis and have a distance therebetween.

The interconnect L1 intersects one of the bit lines BL1, BL3 and BL5. The interconnects L1 adjacent to each other along the y direction face each other with an area below the bit line BL2 or the bit line BL4 sandwiched therebetween. Likewise, the interconnect L2 intersects the bit line BL2 or the bit line BL4. The interconnects L2 adjacent to each other along the y direction face each other with an area below one of the bit lines BL1, BL3 and BL5 sandwiched therebetween.

In the present embodiment, unlike the structure of the second example (FIGS. 19A and 19B), the memory cell MC is provided also between the bit lines BL2 and BL3. As a result, the size of the memory cell MC along the x-axis is 4 F, which is the same as in the structure of the second example. However, the size along the y-axis is 4 F in the second example whereas it is 2 F in the first embodiment. This is because one bit line is used only by one memory cell on the upper side or the lower side along the y-axis of the bit line in the second example, whereas one bit line is shared by memory cells MC both on the upper and lower sides in the first embodiment. As a result, the cell size of a memory device according to the first embodiment can implement $8 F^2$, or the cell size of a DRAM.

Figure 5:
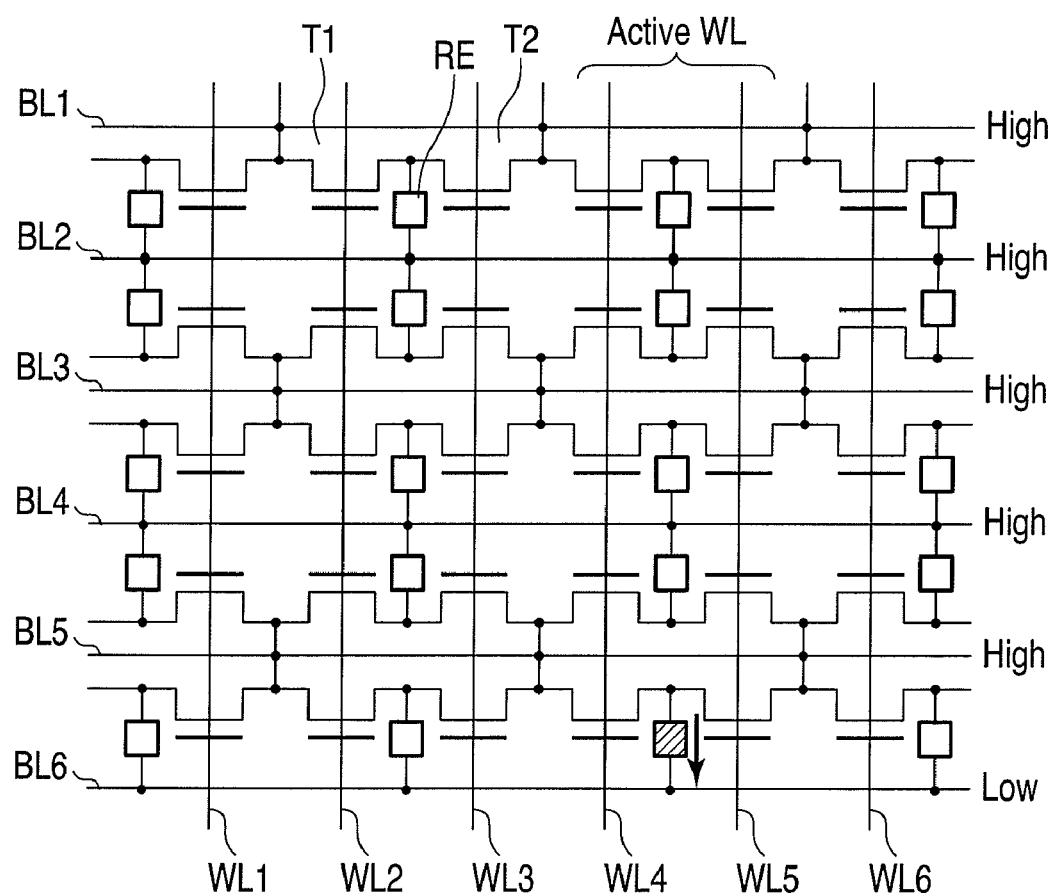
FIG. 5 shows a control method for performing writing to a selected cell and reading from it.

With reference to FIG. 5, control during writing and reading is described. FIG. 5 shows a method of control of bit lines and word lines for writing to a selected cell and reading from the selected cell. In the following description, writing is exemplified; however, control of reading is the same as that of writing although only the current value of reading differs from that of writing. Described in the following is write operation which causes a downward current to flow into the target variable resistance element RE, as indicated by an arrow.

As shown in FIG. 5, in order to perform writing to the variable resistance element RE (highlighted with hatching) of the selected cell, the word lines WL (WL4 and WL5) of the select transistors T1 and T2 of the selected cell are activated. As a result, the select transistors T1 and T2 of the selected cell are turned on. In order to cause a downward current to flow into the target variable resistance element RE, the upper bit line BL5, of two bit lines BL5 and BL6 connected to the selected cell, is at a high level and the lower bit line BL6 is at a low level.

The bit lines BL1 to BL4 which are not connected to the selected cell are electrically connected to the BL5 through the select transistors T1 and T2 connected to the activated word lines WL and the variable resistance elements RE of non-selected cells. Therefore, there is a risk that a current flows from the bit line BL5 to a non-selected cell to cause erroneous writing or reading. To avoid this, as shown in FIG. 5, all the bit lines BL1 to BL4 on a side of the high-level bit line of the selected cell are set at the same high level as that of the bit line BL5, and all bit lines on a side of the low-level bit line of the selected cell are set at the same low level as that of the bit line BL6. This control makes it possible to avoid an undesired current flowing into a non-selected cell to keep selectivity of the cell.

As described above, with a resistance change memory device according to the first embodiment, a memory cell is made up of two select transistors connected in parallel and a variable resistance element connected in series to the select transistors. This enables select transistors with high current drive capacity to ensure a high writing margin. Since both ends of the memory cell are connected to different bit lines, it is possible to cause bidirectional currents to flow into the memory cell. Moreover, since the use of each bit line is shared by groups of memory cells in two rows which are adjacent to the bit line on both sides of the bit line along the y-axis while high current drive capacity is achieved, the size per memory cell can be suppressed to the same level as that of a DRAM, resulting in both improvement in current drive capacity of a select transistor and reduction in cell size. Unlike the structure of the first example (FIGS. 18A and 18B), only one interconnect layer in which bit lines are provided is used. This makes it possible to implement a resistance change memory device which can be manufactured at lower cost and allows a decrease in operation margin caused by manufacturing variations in interconnect resistance to be more suppressed than a resistance change memory device including two interconnect layers.

Second Embodiment

In a second embodiment, regions without memory cells between bit lines are provided at regular intervals in the memory cell array MCA.

Figure 6:
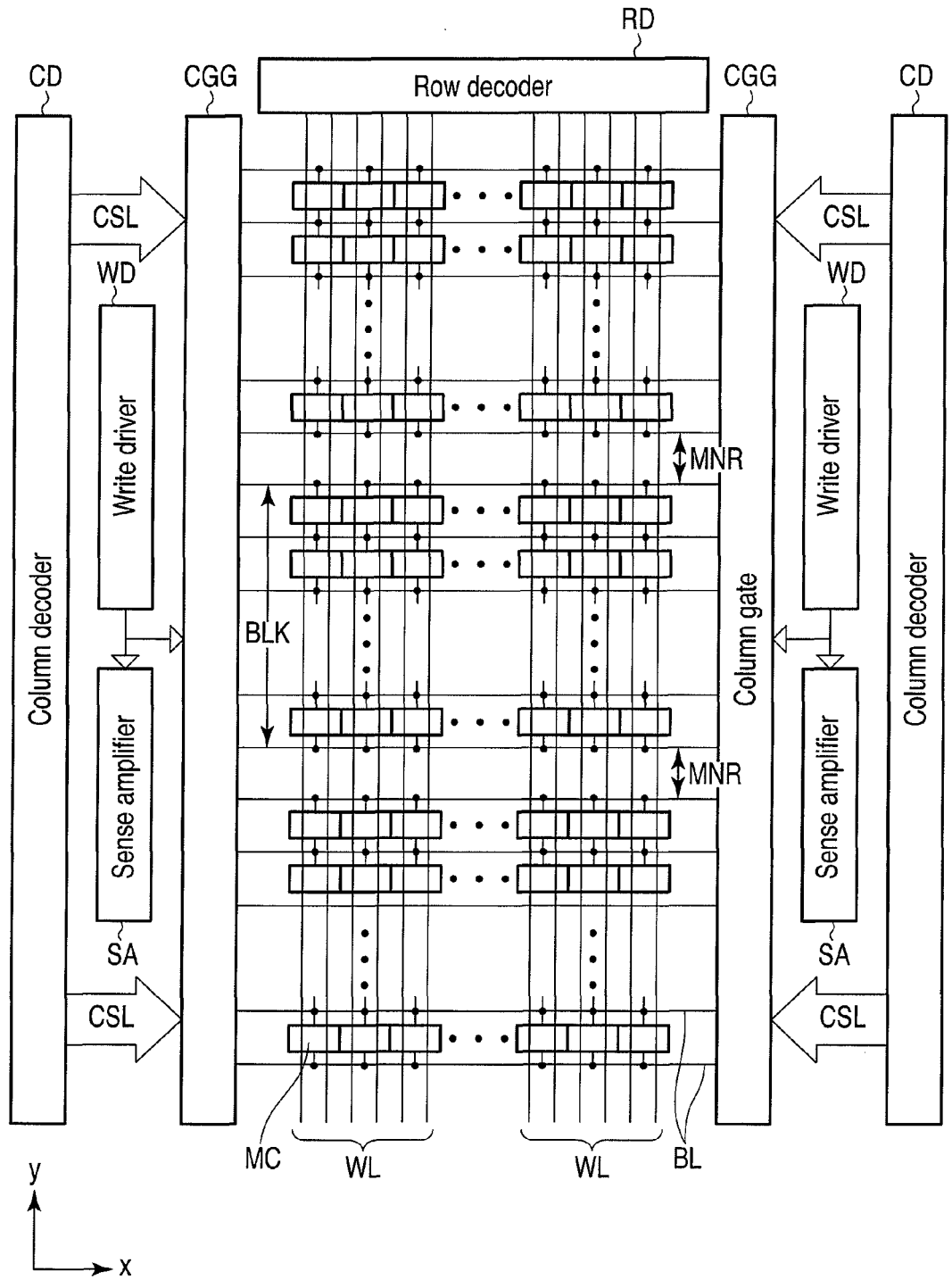
FIG. 6 shows a layout of a memory core of a memory device according to a second embodiment.
Figure 7:
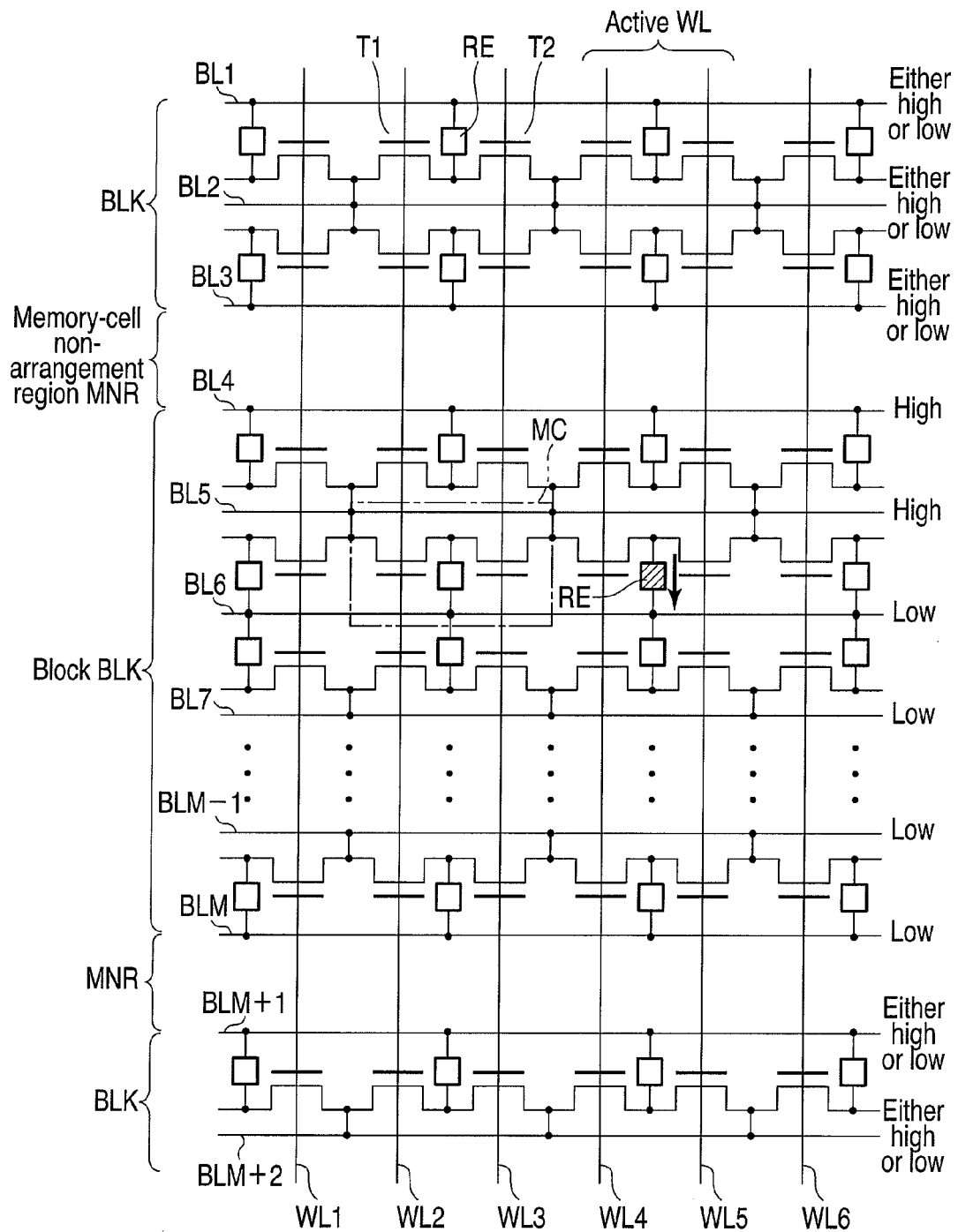
FIG. 7 is a circuit diagram of a memory cell array of the memory device according to the second embodiment.

FIG. 6 shows a layout of components as memory cores of a resistance change memory device according to the second embodiment are seen from above. FIG. 7 is a circuit diagram of a part of a memory cell array of the resistance change memory device according to the second embodiment. As shown in FIGS. 6 and 7, in the memory cell array MCA, bit lines BL are provided along the x-axis at given intervals. Provided between the bit lines BL are memory cells MC each connected to the bit lines BL on the upper and lower sides, as in the first embodiment. On the other hand, in the second embodiment, memory-cell non-arrangement regions MNR in which the memory cells MC are not provided between two bit lines BL are provided along the y-axis at given intervals to be described later. A region between the memory-cell non-arrangement regions is referred to as a "block BLK". The memory cell MC is provided on only one of upper and lower sides of each of bit lines at both ends of the block BLK.

Included in the block are $2^N$ (N is a natural number) memory cells MC and $(2^N+1)$ bit lines BL. Two or more blocks BLK are provided in the memory cell array MCA.

In general, an approach of connecting thousands to tens of thousands of memory cells to one word line to increase storage capacity is employed in a memory device. When the approach is applied to the first embodiment, a current required for charging and discharging the bit lines BL increases, resulting in increased current consumption of the memory chip CH. For example, assuming that the number of memory cells connected to one word line is 4 K (4096), the capacitance of one bit line is 1 pF, the drive voltage of a bit line is 1.5 V, and the cycle time of operation of a resistance change memory device is 50 ns, the consumption current involved in charging and discharging bit lines in one cycle can be calculated as follows.

Bit-line charge and discharge current $I$=(bit-line capacitance×the number of charged and discharged bit lines×bit-line drive voltage)÷cycle time To estimate the maximum current consumption, replace the variables with the values mentioned above. The maximum current consumption reaches the following value. In some cases, it is preferable to take measures against the current consumption.

$I$=(1 pF×4096×1.5 V)÷50 ns=120 mA

One of the measures is dividing the memory cell array MCA into a plurality of blocks BLK. The dividing of the memory cell array MCA can limit the range of bit lines BL for which potential is controlled to one block BLK, as described in the first embodiment. That is, as shown in FIG. 7, in the block BLK including a selected cell which has the variable resistance element RE with hatching, one (the bit line BL5 as an example in FIG. 7) of two bit lines connected to the selected cell is at a high level, and the other (the bit line BL6 as an example in FIG. 7) is at a low level. In addition, in this block BLK, all the bit lines BL on a side of the high-level bit line of the selected cell (upper side as an example in FIG. 7) are at the high level, and all the bit lines BL on a side of the low-level bit line of the selected cell (lower side as an example in FIG. 7) are at the low level. However, potential control of the bit lines BL is unnecessary in blocks other than the block including the selected cell.

The reason why such control is allowed is because, even if the word line WL is activated, a state where bit lines at the boundary of the block BLK are not connected via the memory cell MC can be kept. This significantly reduces the current consumed in charging and discharging the bit lines BL. The smaller the number of memory cells MC along the y-axis per block, the more the consumption current is suppressed. For example, assuming that the number of memory cells MC along the y-axis per block is two, the bit-line charge and discharge current I can be reduced up to 0.06 mA, which is 1/2048 of that in the first embodiment. Accordingly, an increase in electric power from that of a design without the embodiment of the invention would be at a substantially negligible level. However, the memory cell MC is not arranged at a block boundary, and therefore the memory cell density is decreased from that of the first embodiment. For example, in cases where the number of cells in the y-axis direction per block is 2, the effective cell size is as large as 12 $F^2$. The relationship between the typical number of memory cells in the y-axis direction per block and the effective memory cell size is shown in Table 1.

TABLE 1

| Number of memory cells along y-axis per block (cell/block) | Effective cell size |
|---|---|
| 2 | 12 $F^2$ |
| 4 | 10 $F^2$ |
| 8 | 9 $F^2$ |
| 16 | 8.5 $F^2$ |
| 32 | 8.25 $F^2$ |

As seen from Table 1, there is a trade-off relationship between the current increase and the effective cell size. Accordingly, it is necessary to select an appropriate combination of an effective cell size and consumption current as required. For example, if 32 cells/block is selected, the effective cell size is 8.25 $F^2$, and the bit-line charge and discharge current is suppressed to 0.78% of that of the first embodiment (=32/409). That is, with the effective cell size kept to an increase of 3.125% from 8 $F^2$ of a DRAM, the current increase due to introduction of the present embodiment can be suppressed to a negligible level of 1 mA or less.

As described above, with a resistance change memory device according to the second embodiment, as in the first embodiment, a memory cell comprises two select transistors connected in parallel and a variable resistance element connected in series to them, and the use of each bit line is shared by two groups of memory cells adjacent to the bit line on both sides of the bit line along the y-axis. The same effects as in the first embodiment can therefore be obtained. Furthermore, according to the second embodiment, a memory cell array is divided into blocks by a memory-cell non-arrangement region between specific bit lines. Therefore, even if the structure of a memory cell array which has features of the first embodiment is employed, consumption current can be suppressed by suppressing the number of bit lines which require potential control at the time of writing and reading. Particularly, by appropriately selecting the number of memory cells in the y-axis direction per block, high current drive capacity of select transistors, high memory cell density and low consumption power can be achieved.

Third Embodiment

A third embodiment relates to control of peripheral circuits for implementing the first and second embodiments.

FIGS. 8 to 14 are circuit diagrams showing a part of a resistance change memory device according to the third embodiment. FIGS. 8 to 14 show a part of a memory cell array of the first embodiment or a part in a block of a memory cell array of the second embodiment and peripheral circuits. If description of the present embodiment is applied to the second embodiment, assume that a memory cell array of each drawing of the present embodiment corresponds to one block.

Figure 8:
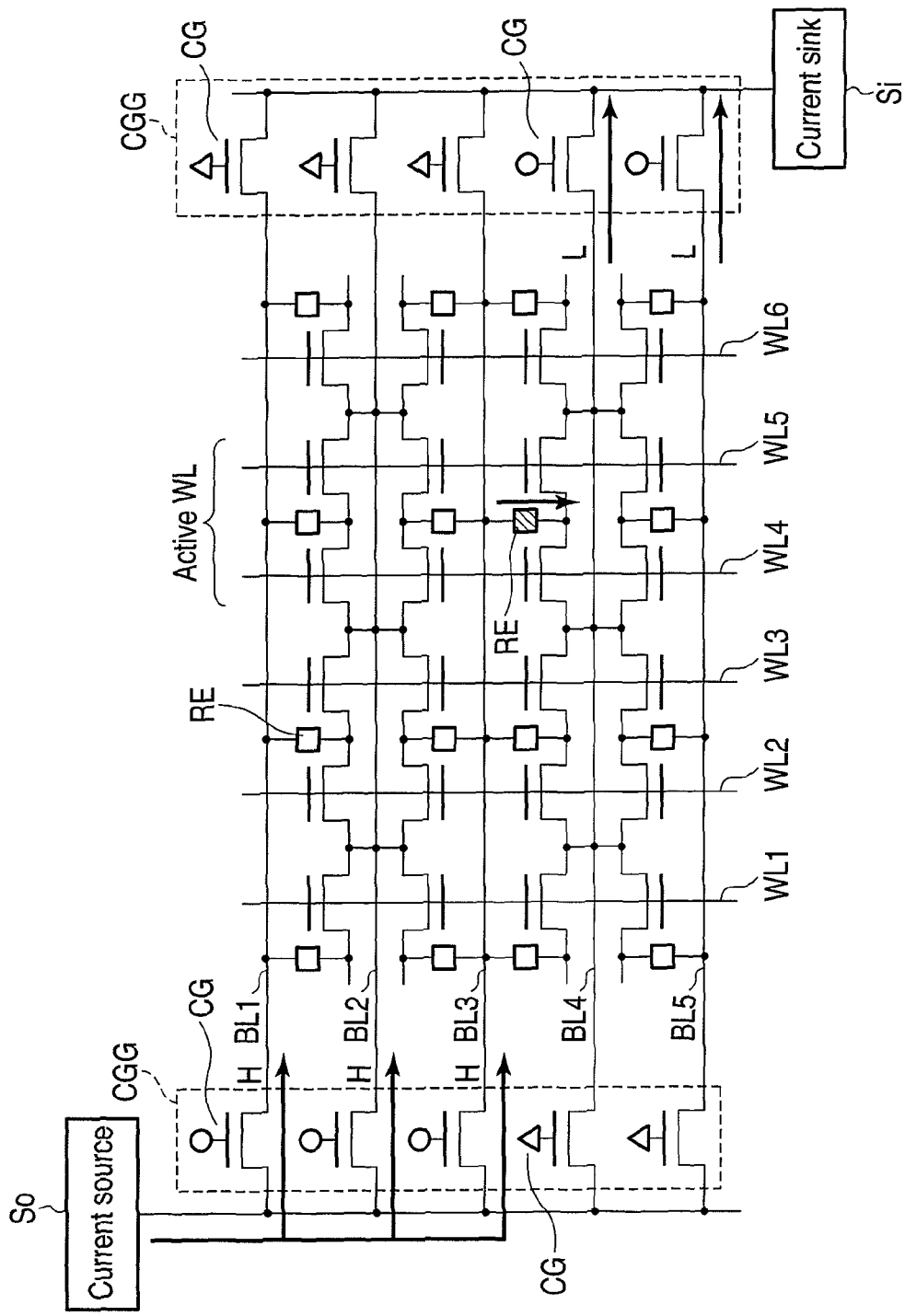
FIG. 8 shows a first example of a memory cell array and circuits related to writing, according to a third embodiment.
Figure 9:
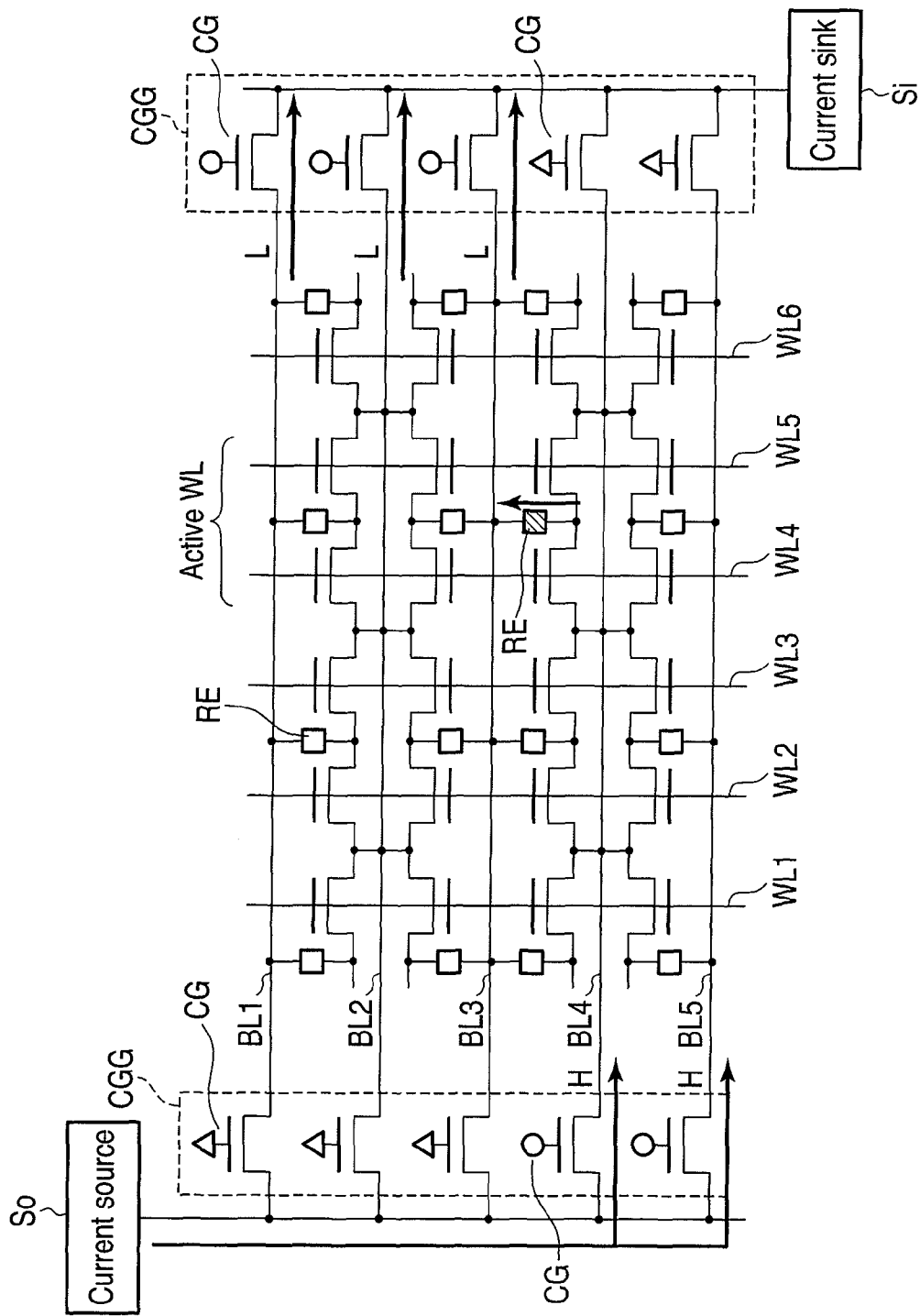
FIG. 9 shows the first example of the memory cell array and the circuits related to writing, according to the third embodiment.

FIGS. 8 and 9 show a first example of a memory cell array and circuits related to writing. As shown in FIGS. 8 and 9, a column gate CGG is made up column gate circuits CG. Each column gate circuit CG is, for example, made of an n-type MOSFET. One end of each column gate circuit CG is connected to an end of the bit line BL. The other end of each column gate circuit CG on one side (left side as an example in FIG. 9) of the bit line BL is connected to a current source circuit So for causing a current to flow into the memory cell MC. The other end of each column gate circuit CG on the other end (right side as an example in FIG. 9) of the bit line BL is connected to a current sink circuit Si for collecting a current from the memory cell MC. The current source circuit So and the current sink circuit Si constitute a part of the write driver circuit WD shown in FIGS. 2 and 6. A control terminal (gate electrode) of each column gate circuit CG is connected to the column select line CSL. FIG. 8 shows the case of passing a current from the top to the bottom of the variable resistance element RE of the selected cell, and FIG. 9 shows the case of passing a current from the bottom to the top of the variable resistance element RE of the selected cell.

In the case of FIG. 8, among the column gate circuits CG connected to the current source circuit So, all the column gate circuits CG connected to all bit lines BL on a current inflow side (upper side in FIG. 8) of the selected cell are turned on, and all the column gate circuits CG connected to all bit lines BL on a current outflow side (lower side in FIG. 8) are turned off. Further, among the column gate circuits CG connected to the current sink circuit Si, all the column gate circuits CG connected to all bit lines BL on the current outflow side of the selected cell are turned on, and all the column gate circuits CG connected to all bit lines BL on the current inflow side are turned off. As a result, the bit lines BL1 to BL3 are at a high level, and the bit lines BL4 and BL5 are at a low level, so that a write current flows from the current source circuit So through the variable resistance element RE of the selected cell to the current sink circuit Si as indicated by an arrow. Note that a high-level voltage is applied to gate electrodes connected to circle symbols, and a low-level voltage is applied to gate electrodes connected to triangle symbols.

On the other hand, in the case of FIG. 9, among the column gate circuits CG connected to the current source circuit So, all the column gate circuits CG connected to all bit lines BL on a current inflow side (lower side in FIG. 9) of the selected cell are turned on, and all the column gate circuits CG connected to all bit lines BL on a current outflow side (upper side in FIG. 9) are turned off. Further, among the column gate circuits CG connected to the current sink circuit Si, all the column gate circuits CG connected to all bit lines BL on the current outflow side of the selected cell are turned on, and all the column gate circuits CG connected to all the bit lines BL on the current inflow side are turned off. As a result, a write current flows from the current source circuit So through the variable resistance element RE of the selected cell to the current sink circuit Si as indicated by an arrow.

Figure 10:
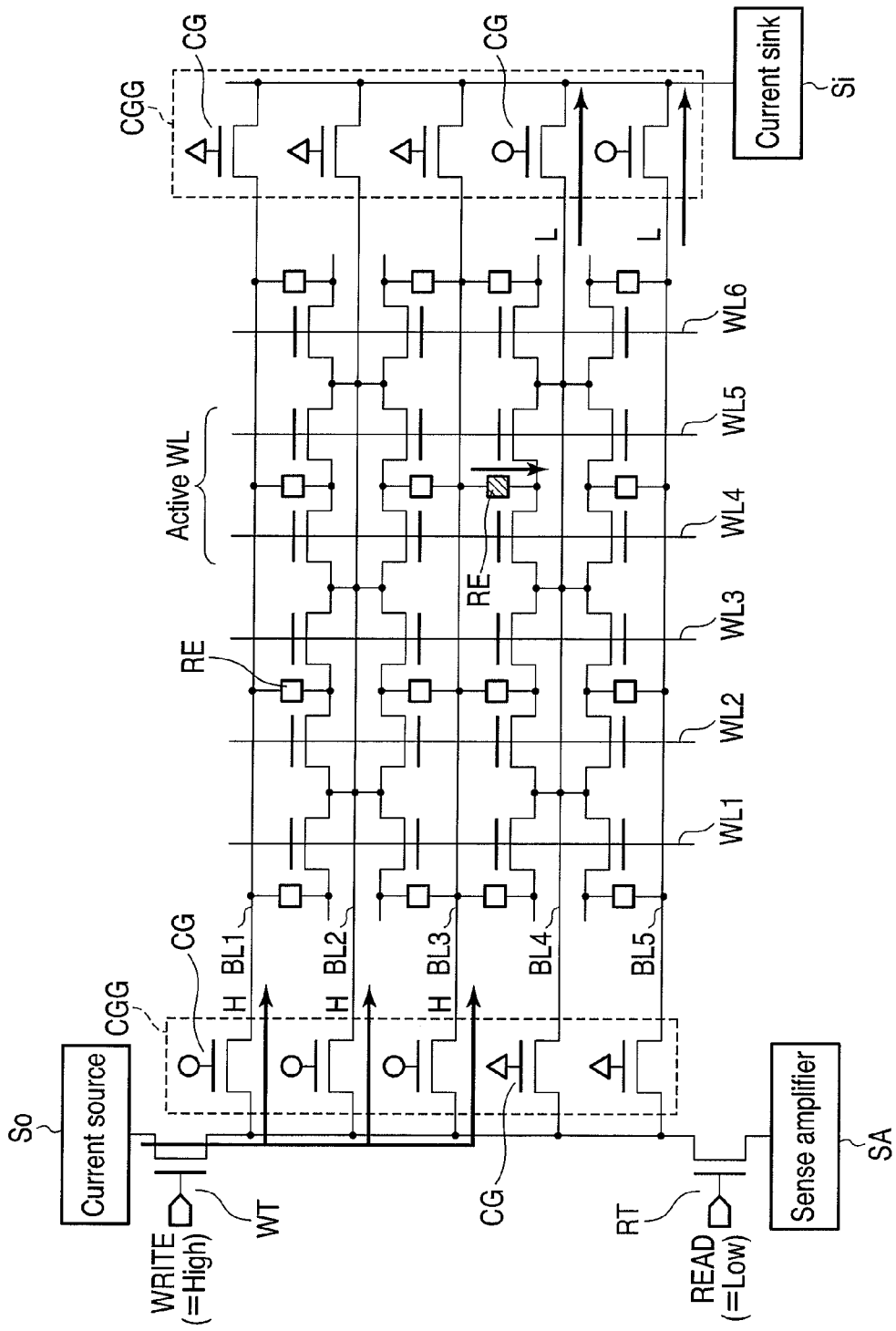
FIG. 10 shows control of writing in a design in which circuits for reading are added to the first example of the third embodiment.

FIGS. 10 and 11 show a design in which circuits for reading are added to the first example; FIG. 10 shows control of writing, and FIG. 11 shows control of reading. As shown in FIGS. 10 and 11, the other end of each column gate circuit CG on one side (left side as an example in FIGS. 10 and 11) of the bit lines BL is connected to a common line CL. One end of the common line CL is connected through a switching circuit WT to the current source circuit So, and the other end is connected through a switching circuit RT to the sense amplifier circuit SA. The switching circuits WT and RT are made of, for example, n-type MOSFETs. An internal signal WRITE is supplied to a gate of the transistor WT, and an internal signal READ is supplied to a gate of the transistor RT. Other designs are the same as those of FIG. 8 or FIG. 9.

As shown in FIG. 10, in the case of writing, the transistor WT is turned on, and the transistor RT is turned off. As a result, the current source circuit So and the common line CL are connected, and the sense amplifier circuit SA and the common line CL are cut off. By performing the same control as that of FIG. 8 or FIG. 9 in this state, a write current flows from the current source circuit So through the variable resistance element RE to the current sink circuit Si as indicated by an arrow. On the other hand, as shown in FIG. 11, in the case of reading, the transistor WT is turned off and the transistor RT is turned on. As a result, the current source circuit So and the common line CL are cut off, and the sense amplifier circuit SA and the common line CL are connected. By performing the same control as that of FIG. 8 or FIG. 9 in this state, a read current flows from the sense amplifier circuit SA through the variable resistance element RE to the current sink circuit Si as indicated by an arrow. As such, by the transistors WT and RT, the common line CL is exclusively connected to the current source circuit So or the sense amplifier circuit SA.

Figure 12:
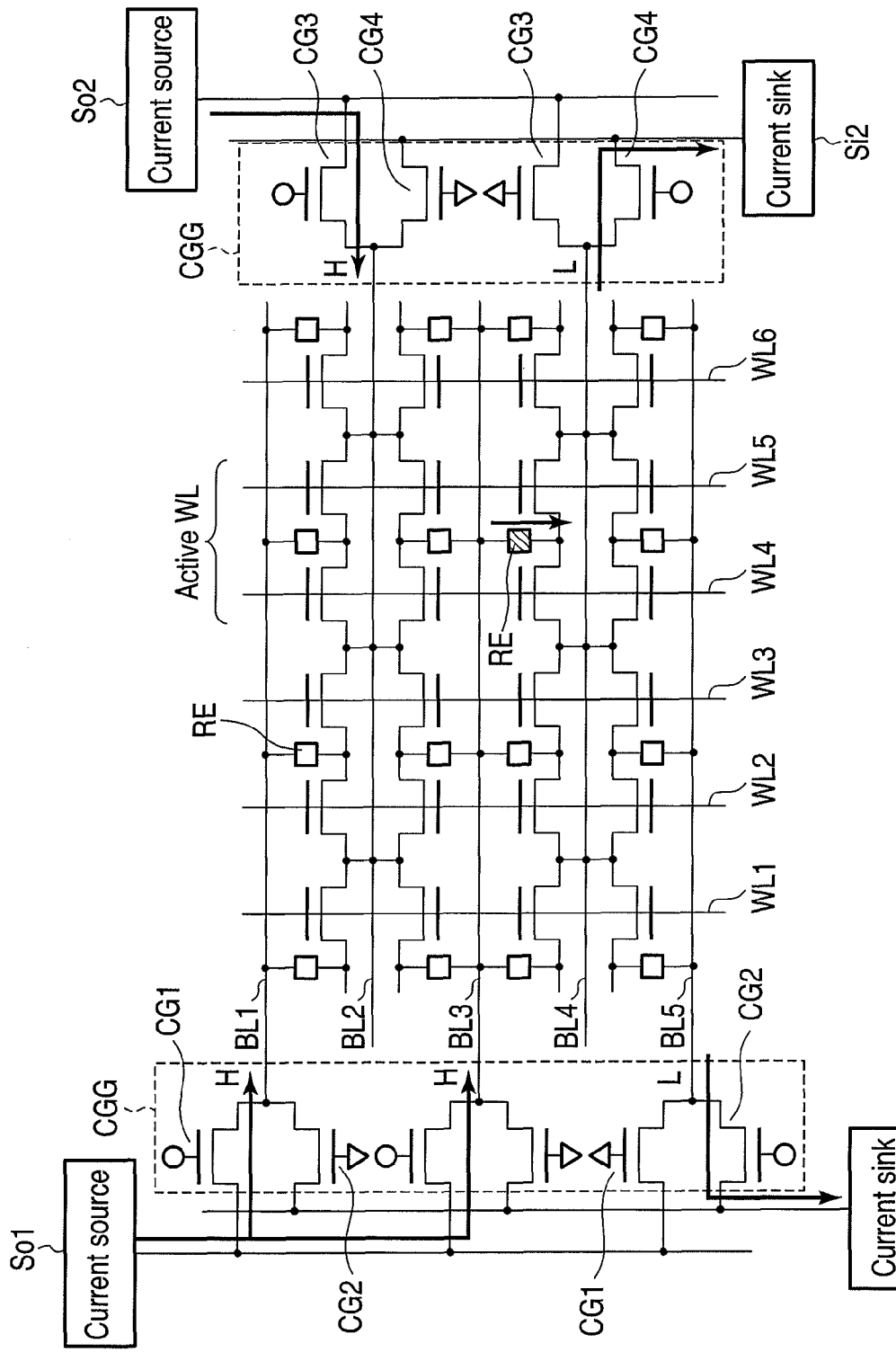
FIG. 12 shows a second example of a memory cell array and circuits related to writing, according to the third embodiment.

FIG. 12 shows a second example of a memory cell array and circuits related to writing. As shown in FIG. 12, one end of each of column gate circuits CG1 and CG2 is connected to one side (left side as an example in FIG. 12) of each of odd-numbered bit lines BL1, BL3 and BL5. The column gate circuits CG1 and CG2 are, for example, made of n-type MOSFETs. The other end of each column gate circuit CG1 is connected to a current source circuit So1. The other end of each column gate circuit CG2 is connected to a current sink circuit Si1. One end of each of column gate circuits CG3 and CG4 is connected to one side (right side as an example in FIG. 12) of each of even-numbered bit lines BL2 and BL4. The column gate circuits CG3 and CG4 are, for example, made of n-type MOSFETs. The other end of each column gate circuit CG3 is connected to a current source circuit So2. The other end of each column gate circuit CG4 is connected to a current sink circuit Si2. Gates of the column gate circuits CG1 to CG4 are connected to the column select lines CSL.

As shown in FIG. 12, in the case of writing, all the column gate circuits CG1 and CG3 connected to all the bit lines BL1, BL2 and BL3 on a current inflow side (upper side as an example in FIG. 12) of the selected cell are turned on, and all the column gate circuits CG2 and CG4 connected to all the bit lines BL1, BL2 and BL3 on the current inflow side are turned off. Further, all the column gate circuits CG1 and CG3 connected to all the bit lines BL4 and BL5 on a current outflow side (lower side as an example in FIG. 12) of the selected cell are turned off, and all the column gate circuits CG2 and CG4 connected to all the bit lines BL4 and BL5 on the current outflow side are turned on. In this way, all the bit lines above the selected cell are at a high level, and all the bit lines below the selected cell are at a low level. As a result, a write current flows from the current source circuits So1 and So2 through the variable resistance element RE of the selected cell to the current sink circuits Si1 and Si2 as indicated by an arrow.

Figure 13:
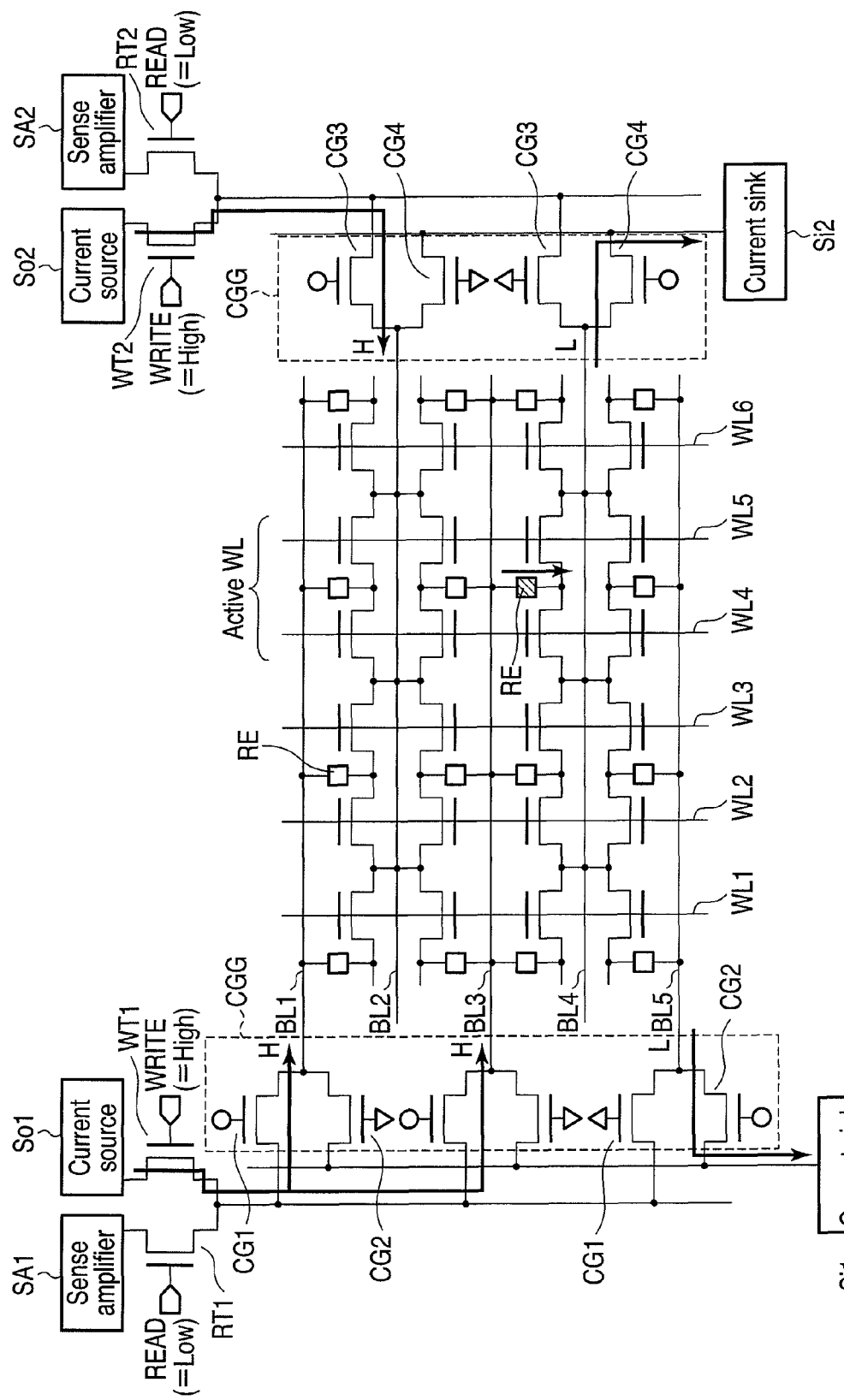
FIG. 13 shows control of writing in a design in which circuits for reading are added to the second example of the third embodiment.
Figure 14:
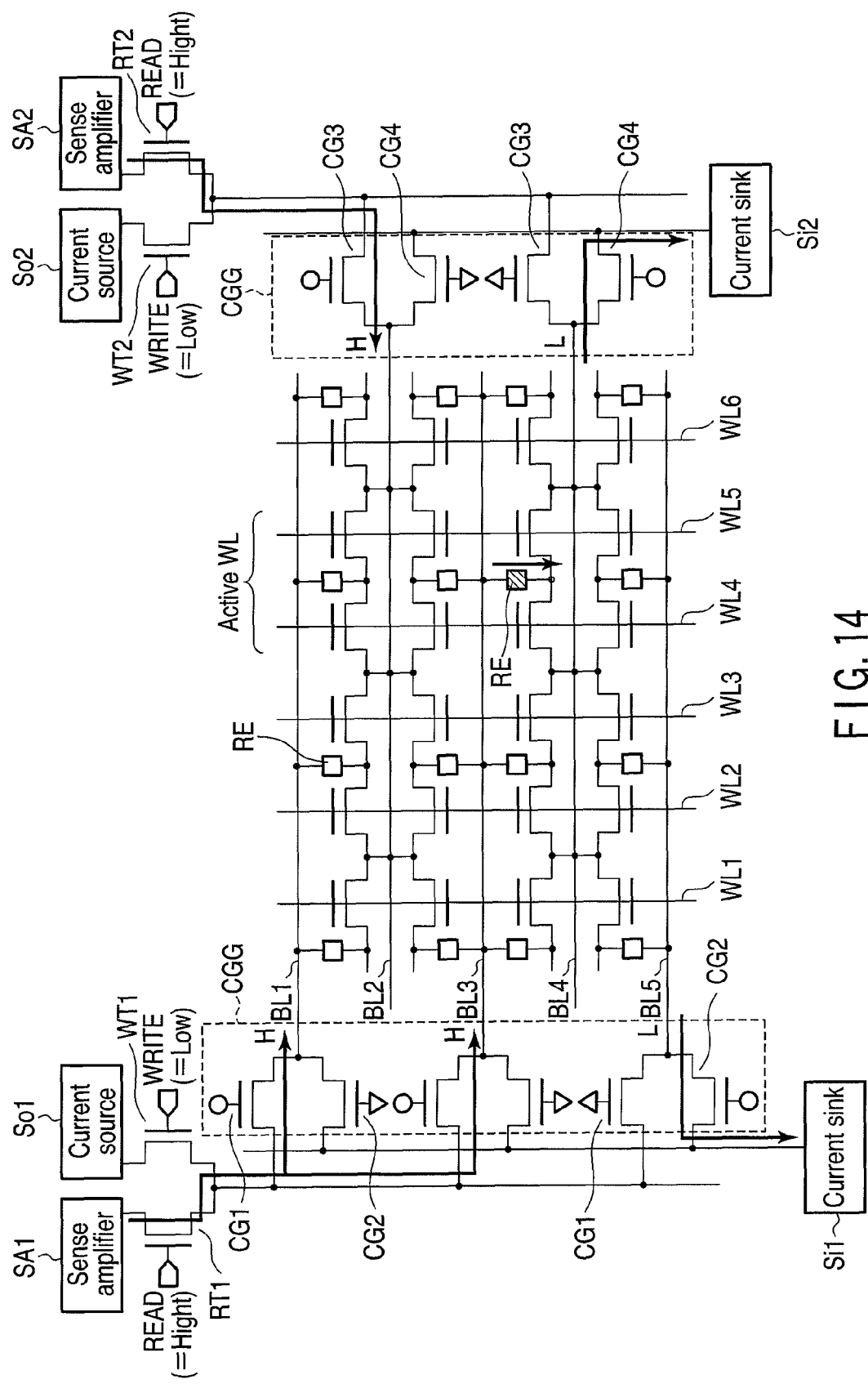
FIG. 14 shows control of reading in the design in which circuits for reading are added to the second example of the third embodiment.

FIGS. 13 and 14 show a design in which circuits for reading are added to the second example; FIG. 13 shows control of writing, and FIG. 14 shows control of reading. As shown in FIGS. 13 and 14, the other end of each column gate circuit CG1 is connected to one end of each of switching circuits WT1 and RT1. The other end of the switching circuit WT1 is connected to the current source circuit So1, and the other end of the switching circuit RT1 is connected to a sense amplifier circuit SA1. The other end of each column gate circuit CG3 is connected to one end of each of switching circuits WT2 and RT2. The other end of the switching circuit WT2 is connected to the current source circuit So2, and the other end of the switching circuit RT2 is connected to a sense amplifier circuit SA2. The switching circuits WT1, WT2, RT1 and RT2 are made of, for example, n-type MOSFETs. The internal signal WRITE is supplied to gates of the transistors WT1 and WT2, and the internal signal READ is supplied to gates of the transistors RT1 and RT2. Other designs are the same as those of FIG. 12.

As shown in FIG. 13, in the case of writing, the transistors WT1 and WT2 are turned on, and the transistors RT1 and RT2 are turned off. As a result, the other ends of the column gate circuits CG1 and CG3 are connected to the current source circuits So1 and So2 and are cut off from the sense amplifier circuits SA1 and SA2. By performing the same control as that of FIG. 12 in this state, a write current flows from the current source circuits So1 and So2 through the variable resistance element RE of the selected cell to the current sink circuits Si1 and Si2 as indicated by an arrow. On the other hand, as shown in FIG. 14, in the case of reading, the transistors WT1 and WT2 are turned off and the transistors RT1 and RT2 are turned on. As a result, the other ends of the column gate circuits CG1 and CG3 are cut off from the current source circuits So1 and So2 and are connected to the sense amplifier circuits SA1 and SA2, respectively. By performing the same control as that of FIG. 12 in this state, a read current flows from the sense amplifier circuits SA1 and SA2 through the variable resistance element RE of the selected cell to the current sink circuits Si1 and Si2 as indicated by an arrow. As such, by the transistors WT1, WT2, RT1 and RT2, the other ends of the column gate circuits are exclusively connected to the current source circuits So1 and So2 or the sense amplifiers SA1 and SA2.

With the resistance change memory device according to the third embodiment, writing and reading can be performed while achieving the effects obtained by the first and second embodiments.

Fourth Embodiment

As described hereinbefore, in the first to third embodiments, potentials of bit lines other than the bit lines connected to the selected cell in a block including the selected cell need to be controlled in both writing and reading. This is restriction specific to the structure of the memory cell array of the first to third embodiments, and its purpose is to prevent an undesired write current or read current from flowing into a non-selected cell. A fourth embodiment relates to control which makes control for more surely preventing the unnecessary current from flowing.

In general, several hundred to several thousand memory cells are connected to bit lines, and therefore parasitic capacitance is formed as shown in FIG. 15. The parasitic capacitance is relatively large and often 1 pF or more. Further, since a bit line is made of a fine metal interconnect, parasitic resistance occurs in the bit line. The parasitic resistance is sometimes several kilohms. Further, parasitic capacitance and parasitic resistance of bit lines sometimes have time constants which differ for every bit line because of manufacturing variations. The charge and discharge speeds of two bit lines connected to a non-selected cell are not always exactly equal. The potentials of the two bit lines finally becomes equal; however, in their transient states, a potential difference between the two bit lines can cause an undesired current to flow in the non-selected cell. The undesired current has a risk of causing errors in writing and reading.

FIG. 16 shows changes in potential of the main components of a resistance change memory device according to the fourth embodiment, which relate to avoidance of such a risk. Note that FIG. 16 exemplifies the case of applying, for example, an asynchronous static random access memory (SRAM)-compatible interface to a resistance change memory device according to the first, second or third embodiment. As shown in FIG. 16, in both writing to and reading from a memory device, the column select line CSL is activated prior to activation of the word line WL. As a result, first, the bit line BL is driven to a given potential while remaining in a high-impedance state. After the voltage is saturated to completely reach a desired value, the word line is driven. This control can prevent an undesired current from flowing in a non-selected cell due to a potential difference formed between bit lines adjacent to each other during charging and discharging of the bit line potential.

With a resistance change memory device according to the fourth embodiment, the column select line is activated prior to activation of word lines in both writing to and reading from a memory. As a result, a potential difference occurs between bit lines adjacent to each other during charging and discharging of the bit lines, and this potential difference prevents an undesired current from flowing in a non-selected cell. This effect is particularly effective in a structure in which the bit lines BL are connected to both sides along the y-axis of the memory cell MC as in the first to third embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance change memory device comprising:
memory cells each comprising two transistors connected in parallel between a first node and a connecting node and a variable resistance element comprising a first end connected to the connecting node and at least two states different in resistance, the memory cells being in a matrix comprising a first axis and a second axis; and
bit lines, wherein
the first node of each memory cell of the memory cells and a second node which is an second end of the variable resistance element of the memory cell are connected to different bit lines among the bit lines,
the first node of a first memory cell of the memory cells and the first node of a second memory cell next to the first memory cell on a first side along the second axis are connected to the same bit line, and
the second node of the first memory cell and the second node of a third memory cell next to the first memory cell on a second side along the second axis are connected to the same bit line.

2. The device of claim 1, wherein the bit lines on the first side along the second axis from one access-target memory cell for writing or reading are at a first potential, and the bit lines on the second side along the second axis from the access-target memory cell are at a second potential, while at least one of writing to the memory cell and reading from the memory cell.

3. The device of claim 1, wherein the bit lines comprise a first group of bit lines shared by the memory cells along the second axis, and a second group of bit lines not shared by the memory cells along the second axis.

4. The device of claim 3, wherein the bit lines on the first side along the second axis from one access-target memory cell for writing or reading are at a first potential, and the bit lines on the second side along the second axis from the access-target memory cell are at a second potential, among bit lines between two bit lines of the second group of bit lines, while at least one of writing to the memory cell and reading from the memory cell.

5. The device of claim 2, wherein the transistors of the access-target memory cell are turned on after the bit lines are set to a given potential before the transistors of one access target memory cell are turned on, while writing to the memory cells and reading from the memory cells.

6. The device of claim 2, further comprising:
a current source circuit connected through gate circuits to a first end of each of the bit lines and configured to cause at least one of the bit lines to be at the first potential; and
a current sink circuit connected through gate circuits to a second end of each of the bit lines and configured to cause at least one of the bit lines to be at the second potential.

7. The device of claim 6, further comprising a sense amplifier connected through the gate circuits to the first end of the bit lines.

8. The device of claim 2, wherein
the device further comprises a first current source circuit and a first current sink circuit connected through gate circuits to a first end of each of the bit lines, and a second current source circuit and a second current sink circuit connected through gate circuits to a second end of each of the bit lines,
the first and second current source circuits are configured to cause at least one of the bit lines to be at the first potential, and
the first and second current sink circuits are configured to cause at least one of the bit lines to be at the second potential.

9. The device of claim 8, further comprising:
a first sense amplifier connected in parallel to the first current source circuit; and
a second sense amplifier connected in parallel to the second current source circuit.

* * * * *